United States Patent
Gonzalez et al.

(10) Patent No.: US 6,683,355 B2
(45) Date of Patent: *Jan. 27, 2004

(54) SEMICONDUCTOR RAISED SOURCE-DRAIN STRUCTURE

(75) Inventors: Fernando Gonzalez, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/008,654

(22) Filed: Nov. 9, 2001

(65) Prior Publication Data

US 2002/0041002 A1 Apr. 11, 2002

Related U.S. Application Data

(62) Division of application No. 09/144,662, filed on Sep. 1, 1998.

(51) Int. Cl.$^7$ ................................................ H01L 27/10
(52) U.S. Cl. ..................... 257/410; 257/386; 257/401; 257/522; 257/408
(58) Field of Search ................................ 257/410, 386, 257/340, 900, 401, 618, 522, 374, 408

(56) References Cited

U.S. PATENT DOCUMENTS

| | | |
|---|---|---|
| 4,470,852 A | 9/1984 | Ellsworth |
| 5,298,765 A | 3/1994 | Nishimura |
| 5,319,232 A | 6/1994 | Pfiester |
| 5,382,809 A | 1/1995 | Nishibayashi et al. |
| 5,595,919 A | 1/1997 | Pan |
| 5,693,974 A | 12/1997 | Hsu et al. |
| 5,736,446 A | 4/1998 | Wu |
| 5,914,519 A | 6/1999 | Chou et al. |
| 5,929,467 A | 7/1999 | Kawai et al. |
| 5,959,337 A | 9/1999 | Gardner et al. |
| 5,977,561 A * | 11/1999 | Wu .............................. 257/67 |
| 6,104,063 A | 8/2000 | Fulford, Jr. et al. |
| 6,127,711 A | 10/2000 | Ono |

OTHER PUBLICATIONS

Wolf et al. (Silicon Processing For The VLSI ERA, vol. 1: Process Technology, pp. 397–399, 1986).
Wong, S. et al., "Elevated Source/Drain MOSFET," 1984 IEDM. Dec. 9–12, 1984, pp. 634–637.
Moravvej–Farshi, M. et al., "Novel Self–Aligned Polysilicon–Gate MOSFETS with Polysilicon Source and Drain," Solid–State Electronics, vol. 30, No. 10, 1987, pp. 1053–1062.

(List continued on next page.)

*Primary Examiner*—George Eckert
*Assistant Examiner*—N. Drew Richards
(74) *Attorney, Agent, or Firm*—Kirkpatrick & Lockhart LLP (57) ABSTRACT

A system comprising a memory device that includes at least one semiconductor structure wherein the semiconductor structure includes a raised source, a raised drain, a gate located between the source and the drain, a first capping layer in communication with at least a portion of the gate and the source, a second capping layer in communication with at least a portion of the gate and the drain, a first portion of a gate oxide region in communication with at least a portion of the gate and the source, a second portion of a gate oxide region in communication with at least a portion of the gate and the drain. The source, the gate, the first capping layer, and the first portion of a gate oxide region define a first gap. The drain, the gate, the second capping layer, and the second portion of a gate oxide region define a second gap. The semiconductor structure also includes a first junction area located beneath the first gap, the gate and the source and a second junction area located beneath the second gap, the gate and the drain. The system also includes a processor and a bus connecting the processor and the memory device.

30 Claims, 5 Drawing Sheets

OTHER PUBLICATIONS

Lynch, W. et al., "UPMOS–A New Approach to Submicron VLSI," Solid State Devices, 1988.

Yamada, T. et al., "Spread/Source Drain (SSD) MOSFET Using Selective Silicon Growth for 64mbit DRAMs," 1989 IEDM, Dec. 3–6, 1989, pp. 35–38.

Shin, H. et al., "MOSFET Drain Engineering Analysis for Deep Submicron Dimensions: Part II—A New Structural Approach for Deep Submicron MOSFETs," SRC, Nov. 1991.

M. Togo et al., "A Gate–side Air–gap Structure (GAS) to Reduce the Parasitic Capacitance in MOSFET," 1996 Symposium on VLSI Technology Digest of Technical Papers, pp. 38–39.

Makino, T. et al., "A Stacked Source Drain MOSFET Using Selective Epitaxy," Fujitsu Limited, Publication Date Unknown.

* cited by examiner

*FIG.13*

SEMICONDUCTOR RAISED SOURCE-DRAIN STRUCTURE

CROSS REFERENCE TO RELATED APPLICATIONS

This is a divisional of co-pending U.S. patent application Ser. No. 09/144,662, filed on Sep. 1, 1998.

STATEMENT REGARDING FEDERALLY SPONSORED RESEARCH (Not Applicable)

BACKGROUND OF THE INVENTION

1. Field of the Invention

The present invention is directed generally to a semiconductor raised source-drain structure and, more particularly, to a semiconductor raised source-drain structure with gate side gaps and pocket junctions.

2. Description of the Background

Raised source and drains have been demonstrated in submicron semiconductor devices. In contrast to conventional source and drains, raised source and drains are vertical structures formed on top of the substrate instead of implanted structures in the substrate surface. Thin film structures are typically inserted between the sidewalls of the gate and the top regions of the raised source and drains to isolate the gate from the source and drains. Such an isolation arrangement, however, can cause excessive capacitive loading from gate to source and drain.

Devices incorporating raised source and drains typically include implanted n-regions under the source and drain regions to create conductive channels between the gate and the source and drains. Such channels do not have good drive and punchthrough capabilities. Also, it is difficult to implant the conductive channels after the polysilicon pattern defining the source and drain structures.

Thus, there is a need for a semiconductor device with raised source and drains that has improved series resistance, good $I_{DS}$ current drive, improved punchthrough leakage, and reduced sidewall capacitance that can be fabricated using standard fabrication techniques.

SUMMARY OF THE INVENTION

The present invention is directed to a system comprising a memory device that includes at least one semiconductor structure wherein the semiconductor structure includes raised source, a raised drain, a gate located between the source and the drain, a first capping layer in communication with at least a portion of the gate and the source, a second capping layer in communication with at least a portion of the gate and the drain, a first portion of a gate oxide region in communication with at least a portion of the gate and the source, a second portion of a gate oxide region in communication with at least a portion of the gate and the drain. The source, the gate, the first capping layer, and the first portion of a gate oxide region define a first gap. The drain, the gate, the second capping layer, and the second portion of a gate oxide region define a second gap. The semiconductor structure also includes a first junction area located beneath the first gap, the gate and the source and a second junction area located beneath the second gap, the gate and the drain. The system also includes a processor and a bus connecting the processor and the memory device.

The present invention represents a substantial advance over prior raised source and drain structures. The present invention has the advantage that it improves the sidewall decoupling of the raised source-drain to the polysilicon gate. In one embodiment, the present invention also has the advantage that it connects the source and drain to the pocket junction next to the gate edge with a high dose implant for reduced series resistance. In another embodiment, the present invention has the further advantage that the full CMOS process flow is reduced compared to typical raised source-drain CMOS process flows by making raised source-drain structures of n+ and p+ polysilicon with respective pocket junctions by implantation. The present invention also has the advantage that conductive source and drain structures can be placed closer to the polysilicon gate, thereby reducing the size of the structure. The present invention also has the advantage that implanted areas between the gate and source and drain structures can be fabricated using conventional semiconductor processing techniques. The present invention has the further advantage that current may move from the implanted areas to the raised source and drain structures with minimal resistance. Those and other advantages and benefits of the present invention will become apparent from the description of the preferred embodiments hereinbelow

BRIEF DESCRIPTION OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements and process steps that are relevant for a clear understanding of the present invention, while eliminating, for purposes of clarity, other elements and process steps found in a typical semiconductor topography. For example, specific methods and steps of removing layers or portions of layers using techniques such as lithography and etching are not described. Those of ordinary skill in the art will recognize that other elements and process steps are desirable and/or required to produce an operational device incorporating the present invention. However, because such elements and process steps are well known in the art, and because they do not facilitate a better understanding of the present invention, a discussion of such elements and process steps is not provided herein.

Figure 1:
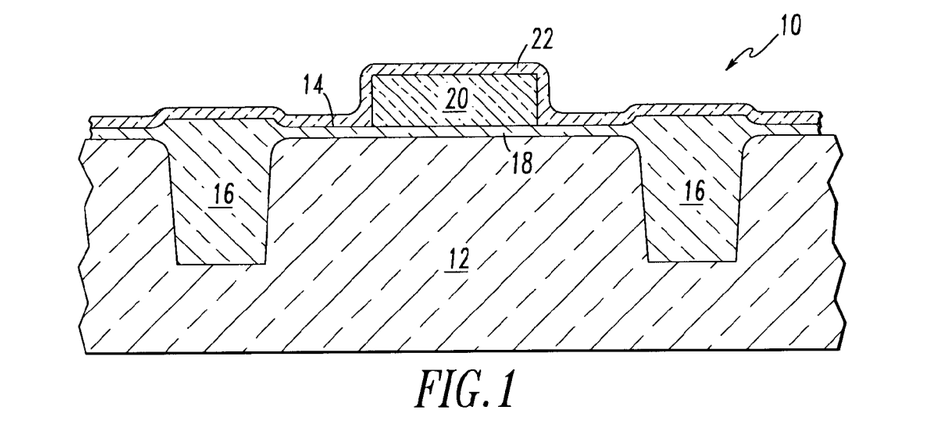
FIG. 1 is a cross-sectional view of a substrate assembly at an early stage of the fabrication process of the present invention.

FIG. 1 is a cross-sectional view of a substrate assembly 10 at an early stage of the fabrication process of the present invention. The substrate assembly 10 includes a substrate layer 12, which is the lowest layer of semiconductor material on a wafer, and additional layers or structures formed thereon. Layers of oxide 14 are formed on the substrate layer 12 to create field oxide regions 16 and gate oxide region 18. The gate oxide region 18 can be, for example, 40 Å thick. The oxide layers 14 can be formed using any conventional process such as, for example, any form of a shallow trench isolation process or any form of a LOCOS process. A polysilicon layer 20 is formed, typically by deposition, and patterned using, for example, a lithography and etch process to provide a gate terminal of a transistor. The layer 20 can extend over the field to form a terminal for interconnect or may be limited to extending over an active channel area. The formation of the polysilicon layer 20 may include deposition of polysilicon by a chemical vapor deposition (CVD) process followed by an ion implantation of a dopant, such as phosphorous, to dope the polysilicon layer 20.

A sacrificial layer 22 is formed on the substrate assembly 10. The sacrificial layer 22 can be any type of dielectric material that is not difficult to remove using typical semiconductor processing techniques such as, for example, a thin layer of a nitride, a photoresist layer, a layer of a polyimide, or a layer of a spin on glass (SOG) material. The sacrificial layer 22 can be deposited by a CVD process or by a spin deposition process and if the layer 22 is applied in a liquid form, it can be baked to form a solid.

Figure 2:
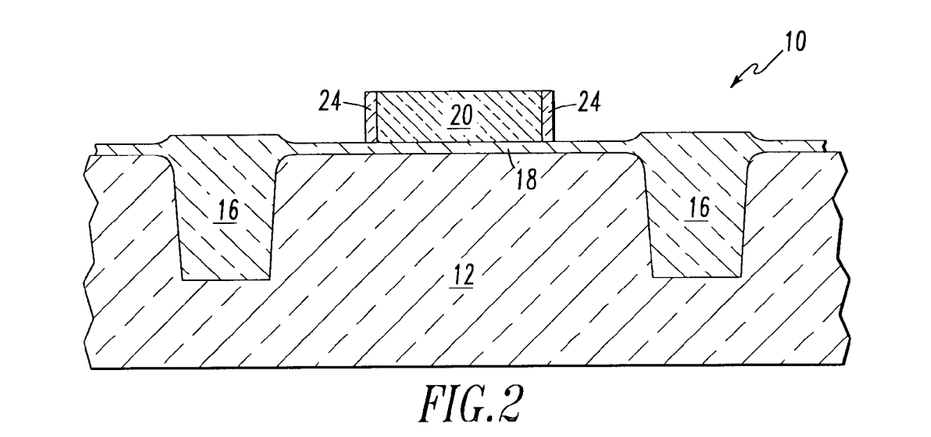
FIG. 2 is a cross-sectional view of the substrate assembly of FIG. 1 after portions of the sacrificial layer have been removed.

FIG. 2 is a cross-sectional view of the substrate assembly 10 of FIG. 1 after portions of the sacrificial layer 22 have been removed. Spacers 24 of the sacrificial layer 22 remain after the removal step. The spacers may be rectangular in shape or may have a curved shape. Portions of the sacrificial layer may be removed using a standard removal technique such as, for example, plasma etching or lithography and etching.

Figure 3:
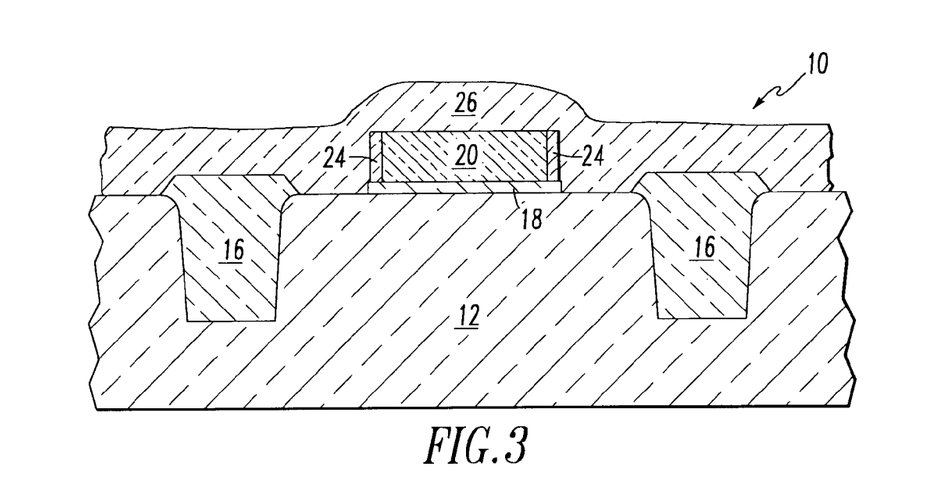
FIG. 3 is a cross-sectional view of the substrate assembly of FIG. 2 after portions of the oxide layer have been removed.

FIG. 3 is a cross-sectional view of the substrate assembly 10 of FIG. 2 after portions of the oxide layers 14 have been removed by a removal process such as, for example, a lithography and etching process. The field oxide regions 16 and the gate oxide region 18 remain after the removal step. A polysilicon layer 26 is formed on the substrate assembly 10, such as by a CVD process.

Figure 4:
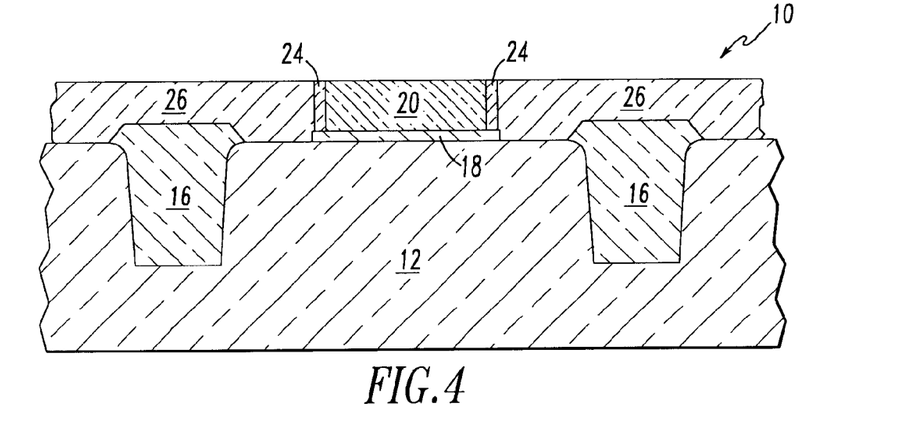
FIG. 4 is a cross-sectional view of the substrate assembly of FIG. 3 after it has been subject to mechanical abrasion to remove portions of the polysilicon layer.

FIG. 4 is a cross-sectional view of the substrate assembly 10 of FIG. 3 after it has been planarized, such as by mechanical abrasion, to remove portions of the polysilicon layer 26. The mechanical abrasion may be performed by a technique such as, for example, chemical mechanical polishing (CMP). The substrate assembly 10 is substantially planar after the planarization.

Figure 5:
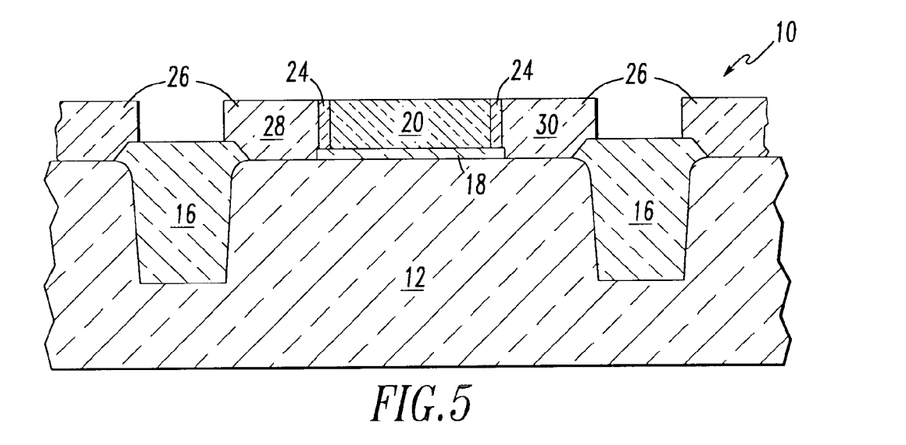
FIG. 5 is a cross-sectional view of the substrate assembly of FIG. 4 after the polysilicon layer has been patterned.

FIG. 5 is a cross-sectional view of the substrate assembly 10 of FIG. 4 after the polysilicon layer 26 has been patterned by, for example, a lithography and etch process. Raised areas 28 and 30 of the polysilicon layer 26 may be raised source and drain regions, respectively, of a transistor.

Figure 6:
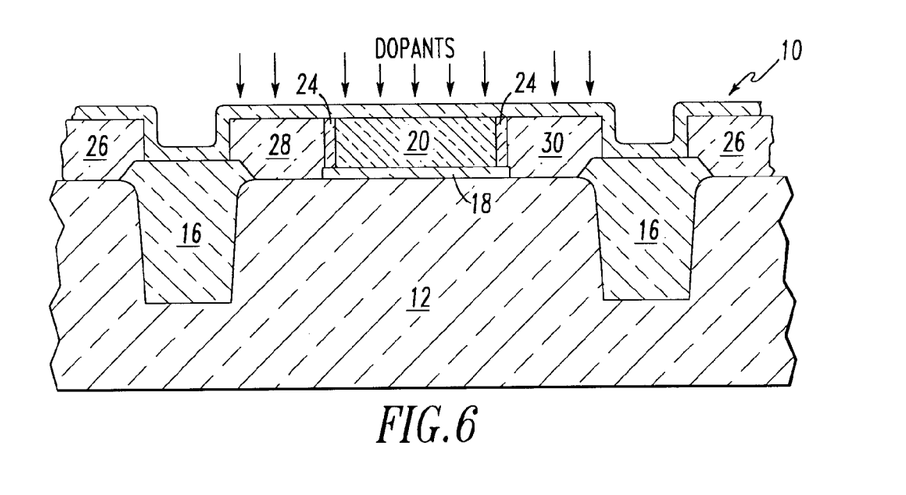
FIG. 6 is a cross-sectional view of the substrate assembly of FIG. 5 after a conductive layer has been formed.

FIG. 6 is a cross-sectional view of the substrate assembly 10 of FIG. 5 after a conductive layer 32 is formed. The conductive layer 32 acts as a conductive path which carries excess charge built up from the ion implantation process off of the wafer, which is connected to an electrical ground. The conductive layer 32 can be any type of conductor suitable for use in a semiconductor such as, for example, titanium silicide or titanium. The substrate assembly 10 is then masked (not shown) and n+ or p+ dopants are implanted into the polysilicon layer 20 and the raised areas 28 and 30 depending on the type of device being fabricated. The dopants may be, for example, phosphorous, arsenic, or boron atoms.

Figure 7:
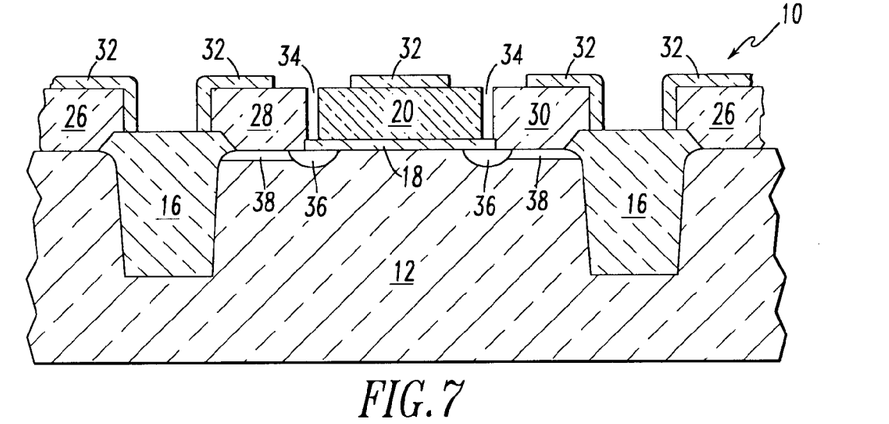
FIG. 7 is a cross-sectional view of the substrate assembly of FIG. 6 after portions of the conductive layer have been removed.

FIG. 7 is a cross-sectional view of the substrate assembly 10 of FIG. 6 after portions of the conductive layer 32 have been removed. The portions of the conductive layer 32 can be removed by, for example, a lithography and etch process. Although certain portions of the conductive layer 32 are shown, the lithography and etch process may eliminate more or less of the conductive layer 32 than is shown in FIG. 7 depending on variations in fabrication processes and depending on whether a mask is used in the etch process. The amount of the conductive layer 32 that is removed does not affect the resultant substrate assembly 10. The spacer areas 24 are also removed by a process such as etching to create gaps 34. The gaps 34 may be 100 to 500 Å wide, depending on the height of the polysilicon layer 20 and the raised areas 28 and 30. The gaps 34 may be filled with a gas such as, for example, nitrogen, argon, oxygen, or a mixture of such gases (air). A vacuum may also be created in the gaps 34.

The substrate assembly 10 may be masked and blankets of n+ or p+ dopants may be implanted, depending on the type of device being fabricated, beneath the gaps 34 and into the substrate layer 12 to create pocket implant junction areas 36, which extend partially under the polysilicon layer 20 and the raised areas 28 and 30. The areas 36 thus create low series resistance paths. The n+ blanket implant diffuses into the p-channel but is counterdoped by the p+ blanket implant. The excess dopant thus acts as a p-channel punchthrough halo implant. The doping process of the polysilicon layer 20 and the raised areas 28 and 30 as described in conjunction with FIG. 6 creates negatively doped outdiffusion areas 38. The outdiffusion areas 38 may be 50 to 200 Å thick.

The substrate assembly 10 is subject to a low temperature RTP sinter process. Portions of the conductive layer 32 are converted to a nitride by the sinter process. The substrate is then subjected to a lithography and etch process to remove some of the nitride in the conductive layer 32. The substrate assembly 10 is then subject to an RTP anneal process. The anneal process causes the conductive layer 32 to become more dense and to better adhere to the substrate assembly 10.

Figure 8:
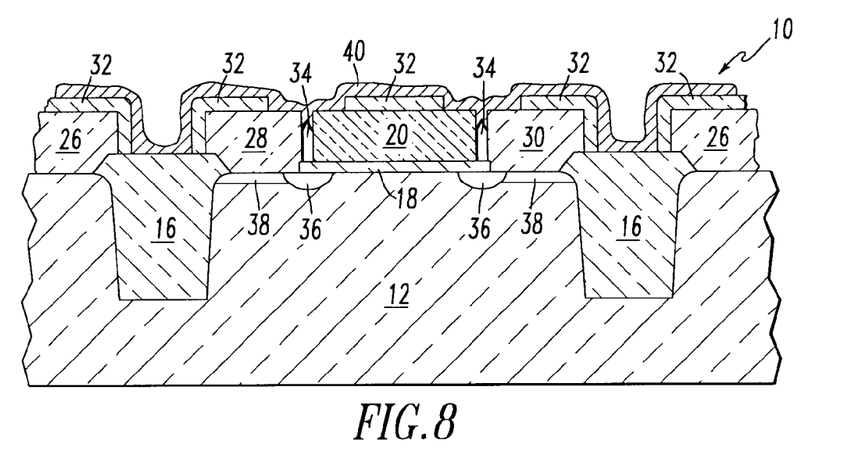
FIG. 8 is a cross-sectional view of the substrate assembly of FIG. 7 after a nonconformal capping layer has been deposited.

FIG. 8 is a cross-sectional view of the substrate assembly 10 of FIG. 7 after a nonconformal capping layer 40 has been deposited. The nonconformal layer 40 can be any type of insulative material suitable to seal the gaps 34 such as, for example, a deposited layer of oxide.

Figure 9:
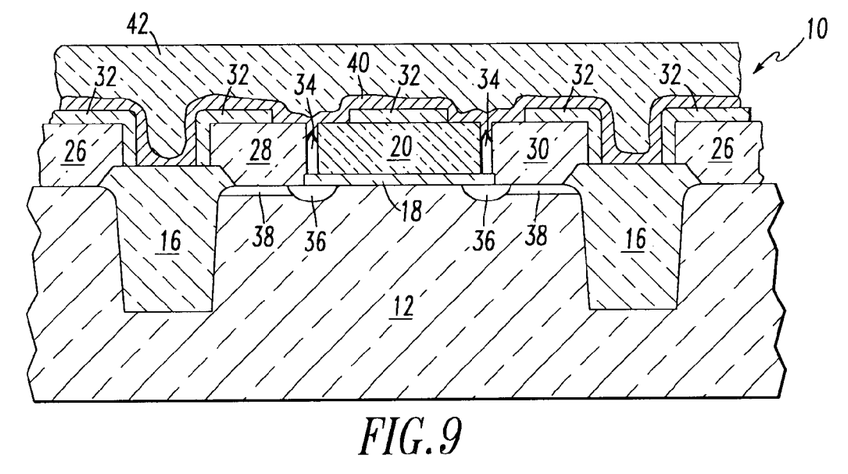
FIG. 9 is a is a cross-sectional view of the substrate assembly of FIG. 8 after an insulative layer has been deposited and the substrate assembly has been subject to a mechanical abrasion process.

FIG. 9 is a cross-sectional view of the substrate assembly 10 of FIG. 8 after an insulative layer 42 has been deposited and the substrate assembly 10 has been subject to a planarization process, such as mechanical abrasion. The mechanical abrasion may be performed by, for example, chemical mechanical polishing. The substrate assembly 10 is substantially planar after the planarization. The layer 42 may be a material such as doped oxide that is formed by a CVD process. Such doped oxide may be, for example, phosphosilicate glass (PSG) or borophosphosilicate glass (BPSG).

Figure 10:
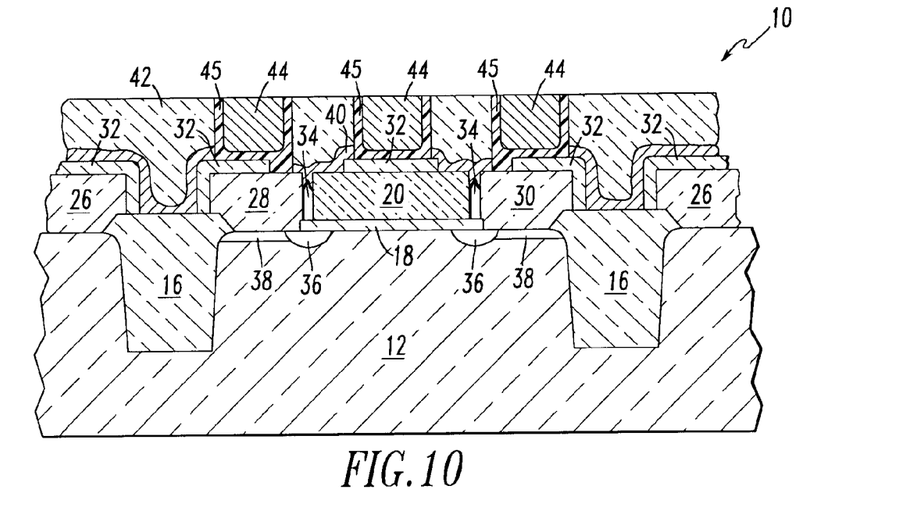
FIG. 10 is a cross-sectional view of the substrate assembly of FIG. 9 after contact areas have been patterned and plugs have been formed.

FIG. 10 is a cross-sectional view of the substrate assembly 10 of FIG. 9 after contact areas have been patterned by, for example, a lithography and etch process, and plugs 44 have been formed. The plug areas 44 may consist of any type of material suitable such as, for example, aluminum, copper, or tungsten. An adhesion layer 45 may be deposited in the contact areas to promote adhesion of the plugs 44 to the conductive layer 32, the polysilicon layer 20, and the raised areas 28 and 30. The adhesion layer may be a material such as, for example, Ti, TiW, TiN, $WSi_x$, Ti/TiN, Ti/Cu, Cr/Cu, TiN/Cu, or Ta/Cu.

Figure 11:
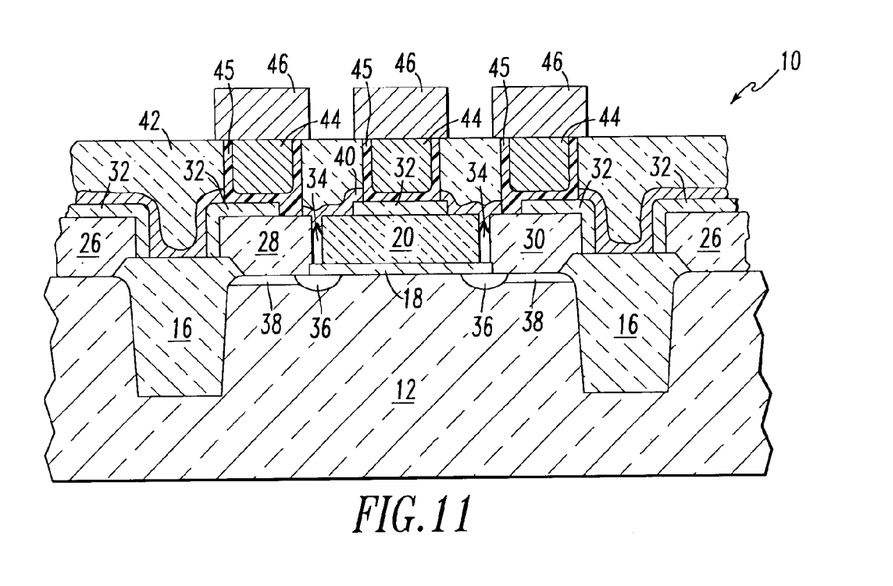
FIG. 11 is a cross-sectional view of the substrate assembly of FIG. 10 after metal layers have been formed and patterned.

FIG. 11 is a cross-sectional view of the substrate assembly 10 of FIG. 10 after metal layers 46 have been formed and patterned. The metal layers 46 may be constructed of any material suitable for semiconductor interconnect structures such as, for example, aluminum or copper. The metal layers may be formed by, for example, a CVD process, by electroplating, or by electroless plating. Further metal layers may be formed on the substrate assembly 10 to form an interconnect structure. Such metal layers are not illustrated in FIG. 11.

Figure 12:
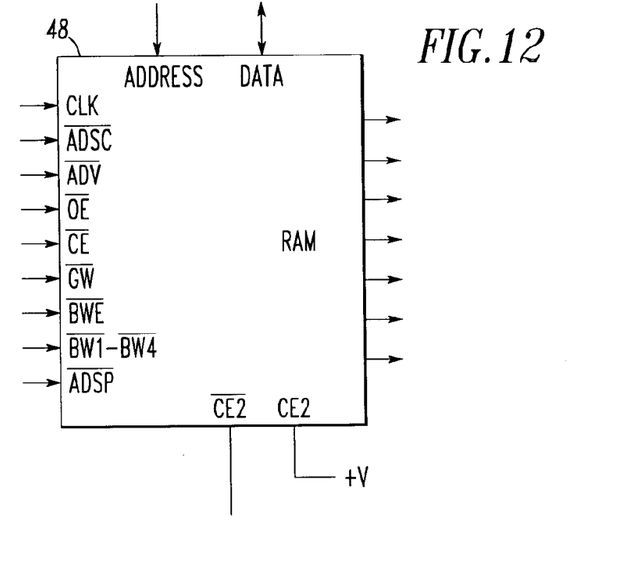
FIG. 12 illustrates a semiconductor device in which the present invention may be employed.

FIG. 12 illustrates a semiconductor device 48 in which the present invention may be employed. The semiconductor device 48 may be any type of solid state device such as, for example, a memory device.

Figure 13:
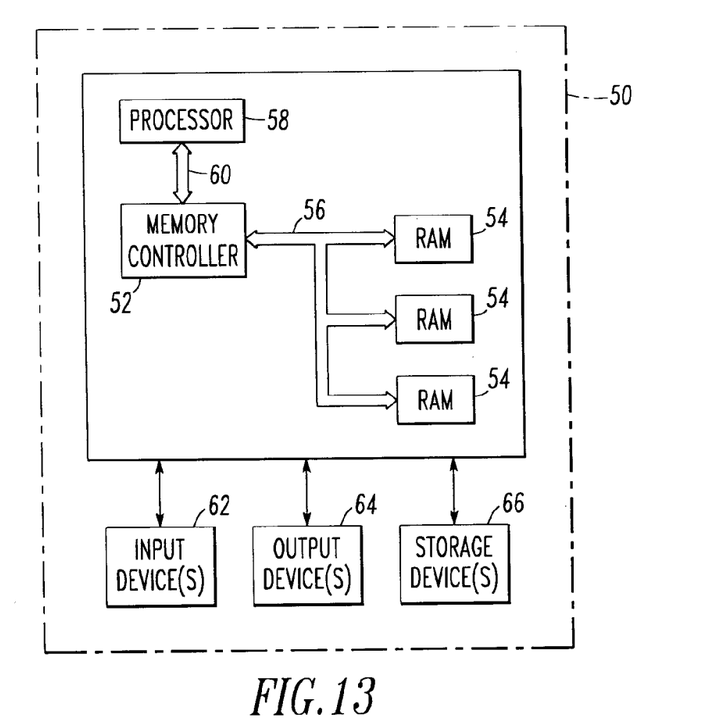
FIG. 13 is a block diagram illustrating a computer system.

FIG. 13 is a block diagram illustrating a computer system 50. The system 50 utilizes a memory controller 52 in communication with RAMs 54 through a bus 56. The memory controller 52 is also in communication with a processor 58 through a bus 60. The processor 58 can perform a plurality of functions based on information and data stored in the RAMs 54. One or more input devices 62, such as, for example, a keypad or a mouse, are connected to the processor 58 to allow an operator to manually input data, instructions, etc. One or more output devices 64 are provided to display or otherwise output data generated by the processor 58. Examples of output devices include printers and video display units. One or more data storage devices 66 may be coupled to the processor 58 to store data on, or retrieve information from, storage media. Examples of storage devices 66 and storage media include drives that accept hard and floppy disks, tape cassettes, and CD read only memories. The raised source-drain structures of the present invention can be incorporated in circuits on all of the devices in the system 50.

While the present invention has been described in conjunction with preferred embodiments thereof, many modifications and variations will be apparent to those of ordinary skill in the art. The foregoing description and the following claims are intended to cover all such modifications and variations.

What is claimed is:

1. A system, comprising:
  a memory device having at least one semiconductor structure formed on a substrate assembly, said structure including:
    a raised source;
    a raised drain;
    a gate located between said source and said drain;
    a first capping layer in communication with at least a portion of said gate and said source;
    a first portion of a gate oxide region in communication with at least a portion of said gate and said source;
    said source, said gate, said first capping layer, and said first portion of said gate oxide region defining a first gap therein, said first gap having one of a gas and a vacuum therein, wherein no dielectric material is positioned between said first gap and any one of said gate, said source, said first capping layer, and said first portion of said gate oxide region;
    a first implant junction area located in said substrate assembly beneath said first gap and extending partially beneath said gate and said source;
    a second capping layer in communication with at least a portion of said gate and said drain;
    a second portion of said gate oxide region in communication with at least a portion of said gate and said drain;
    said drain, said gate, said second capping layer, and said second portion of said gate oxide region defining a second gap therein, said second gap having one of a gas and a vacuum therein, wherein no dielectric material is positioned between said second gap and any one of said gate, said drain, said second capping layer, and said second portion of said gate oxide region; and
    a second implant junction area located in said substrate assembly beneath said second gap and extending partially beneath said gate and said drain;
  a processor; and
  a bus connecting said processor and said memory device.

2. The system of claim 1, wherein said raised source includes doped polysilicon.

3. The system of claim 1, wherein said raised drain includes doped polysilicon.

4. The system of claim 1, wherein said gate includes doped polysilicon.

5. The system of claim 1, wherein said first gap is approximately 100 to 500 Å wide.

6. The system of claim 1, wherein said second gap is approximately 100 to 500 Å wide.

7. The system of claim 1, wherein said source includes a plug.

8. The system of claim 7, wherein said plug includes an adhesive layer.

9. The system of claim 1, wherein said gate includes a gate terminal.

10. The system of claim 1, wherein said memory device includes a memory controller.

11. The system of claim 1, wherein said memory device is in communication with at least one random access memory.

12. The system of claim 1, further comprising at least one input device connected to said processor.

13. The system of claim 12, wherein said input device includes a keypad.

14. The system of claim 12, wherein said input device includes a mouse.

15. The system of claim 1, further comprising at least one output device connected to said processor.

16. The system of claim 15, wherein said output device includes a printer.

17. The system of claim 15, wherein said output device includes a video display.

18. The system of claim 1, further comprising at least one storage device coupled to said processor.

19. The system of claim 18, wherein said storage device includes a drive.

20. The system of claim 19, wherein said drive includes a hard drive.

21. The system of claim 19, wherein said drive includes a floppy drive.

22. The system of claim 19, wherein said drive includes a tape cassette.

23. The system of claim 19, wherein said drive includes a CD drive.

24. The system of claim 1, wherein a portion of said raised drain is substantially co-planar with a portion of at least one of said gate and said raised source.

25. The system of claim 1, wherein a portion of said gate is substantially co-planar with a portion of said raised source.

26. The system of claim 1, wherein a portion of said raised drain is substantially co-planar with at least a portion of both said gate and said raised source.

27. The system of claim 1, wherein a portion of at least one of said first and second gaps is substantially co-planar with a portion of at least one of said gate, said raised source, and said raised drain.

28. A system, comprising:
- a memory device having at least one semiconductor structure formed on a substrate assembly, said structure including:
  - a raised source;
  - a raised drain;
  - a gate located between said source and said drain;
  - a first capping layer in communication with at least a portion of said gate and said source;
  - a first portion of a gate oxide region in communication with at least a portion of said gate and said source;
  - said source, said gate, said first capping layer, and said first portion of said gate oxide region defining a first gap therein, said first gap having one of a gas and a vacuum therein, wherein no dielectric material is positioned between said first gap and any one of said gate, said source, said first capping layer, and said first portion of said gate oxide region;
  - a first implant junction area located in said substrate assembly beneath said first gap and extending partially beneath said gate and said source, wherein said first junction area includes doped silicon areas;
  - a second capping layer in communication with at least a portion of said gate and said drain;
  - a second portion of said gate oxide region in communication with at least a portion of said gate and said drain;
  - said drain, said gate, said second capping layer, and said second portion of said gate oxide region defining a second gap therein, said second gap having one of a gas and a vacuum therein, wherein no dielectric material is positioned between said second gap and any one of said gate, said drain, said second capping layer, and said second portion of said gate oxide region; and
  - a second implant junction area located in said substrate assembly beneath said second gap and extending partially beneath said gate and said drain, wherein said second junction area includes doped silicon areas;
- a processor; and
- a bus connecting said processor and said memory device.

29. The system of claim 28, wherein said doped silicon areas include phosphorous.

30. A system, comprising:
- a memory device having at least one semiconductor structure formed on a substrate assembly, said structure including:
  - a raised source;
  - a raised drain;
  - a gate located between said source and said drain;
  - a first capping layer in communication with at least a portion of said gate and said source;
  - a first portion of a gate oxide region in communication with at least a portion of said gate and said source;
  - said source, said gate, said first capping layer, and said first portion of said gate oxide region defining a first gap therein, said first gap having one of a gas and a vacuum therein, wherein no dielectric material is positioned between said first gap and any one of said gate, said source, said first capping layer, and said first portion of said gate oxide region;
  - a first implant junction area located in said substrate assembly beneath said first gap and extending partially beneath said gate and said source, wherein said first junction area includes a pocket implant junction;
  - a second capping layer in communication with at least a portion of said gate and said drain;
  - a second portion of said gate oxide region in communication with at least a portion of said gate and said drain;
  - said drain, said gate, said second capping layer, and said second portion of said gate oxide region defining a second gap therein, said second gap having one of a gas and a vacuum therein, wherein no dielectric material is positioned between said second gap and any one of said gate, said drain, said second capping layer, and said second portion of said gate oxide region; and
  - a second implant junction area located in said substrate assembly beneath said second gap and extending partially beneath said gate and said drain, wherein said second junction area includes a pocket implant junction;
- a processor; and
- a bus connecting said processor and said memory device.

* * * * *

UNITED STATES PATENT AND TRADEMARK OFFICE
CERTIFICATE OF CORRECTION

PATENT NO. : 6,683,355 B2
DATED : January 27, 2004
INVENTOR(S) : Gonzalez et al.

It is certified that error appears in the above-identified patent and that said Letters Patent is hereby corrected as shown below:

<u>Title page,</u>
Item [56], References Cited, OTHER PUBLICATIONS, "Wolf et al." please delete "vol." and insert -- Vol. -- therefor. "Wong, S. et al." please delete "IEDM." and insert -- IEDM, --
therefor. "Moravvej-Farshi, M. et al" please delete "vol." and insert -- Vol. -- therefor.

<u>Column 2,</u>
Line 50, please delete one instance of "is a".

Signed and Sealed this

Twenty-fifth Day of May, 2004

JON W. DUDAS
*Acting Director of the United States Patent and Trademark Office*